United States Patent
Agami

(10) Patent No.: US 9,116,791 B2
(45) Date of Patent: Aug. 25, 2015

(54) METHOD FOR FLASH-MEMORY MANAGEMENT

(75) Inventor: Mishael Agami, Netanya (IL)

(73) Assignee: SANDISK IL LTD., Kfar Saba (IL)

( * ) Notice: Subject to any disclaimer, the term of this patent is extended or adjusted under 35 U.S.C. 154(b) by 59 days.

(21) Appl. No.: 11/567,742

(22) Filed: Dec. 7, 2006

(65) Prior Publication Data

US 2007/0136509 A1    Jun. 14, 2007

Related U.S. Application Data

(60) Provisional application No. 60/748,682, filed on Dec. 9, 2005.

(51) Int. Cl.
   *G06F 12/02* (2006.01)
   *G06F 3/06* (2006.01)
   *G11C 16/10* (2006.01)

(52) U.S. Cl.
   CPC .......... *G06F 12/0246* (2013.01); *G06F 3/0616* (2013.01); *G06F 3/0643* (2013.01); *G06F 3/0679* (2013.01); *G06F 2212/1016* (2013.01); *G06F 2212/1036* (2013.01); *G06F 2212/7201* (2013.01); *G06F 2212/7207* (2013.01); *G11C 16/102* (2013.01)

(58) Field of Classification Search
   USPC .......................... 711/2, 103, 115; 365/189.33
   See application file for complete search history.

(56) References Cited

U.S. PATENT DOCUMENTS

| | | |
|---|---|---|
| 5,404,485 A | 4/1995 | Ban |
| 5,778,418 A | 7/1998 | Auclair et al. |
| 5,971,282 A * | 10/1999 | Rollender et al. ............. 235/492 |
| 6,400,633 B1 * | 6/2002 | Al-Shamma et al. ..... 365/189.15 |
| 6,456,528 B1 | 9/2002 | Chen |
| 6,549,974 B2 * | 4/2003 | Kaki et al. ..................... 711/103 |

(Continued)

FOREIGN PATENT DOCUMENTS

| | | |
|---|---|---|
| EP | 1596326 A2 | 11/2005 |
| JP | 11-007408 A | 1/1999 |

(Continued)

OTHER PUBLICATIONS

European Supplemental Search Report and Written Opinion for European Application No. 06821613.4, dated Oct. 22, 2009, 6 pages.

(Continued)

*Primary Examiner* — Yaima Rigol
(74) *Attorney, Agent, or Firm* — Toler Law Group, PC

(57) ABSTRACT

A SIM card including: (a) a first NVM for storing user data; and (b) a second NVM, separate from the first NVM, for storing management data related to the user data. Preferably, the first NVM is block-erasable and the second NVM is word-erasable erasable. Preferably, the first NVM is a flash memory and the second NVM is an EEPROM. Preferably, the management data includes a mapping table for mapping virtual addresses, of the first NVM, to physical device addresses. Preferably, the user data and the management data are organized in a file system. Most preferably, the management data includes at least one file allocation table. Most preferably, the management data includes at least one files directory, wherein at least one files directory includes at least one item selected from the group consisting of: a file name, a file size, a file attribute, and a physical address of a file sector.

23 Claims, 3 Drawing Sheets

(56) References Cited

U.S. PATENT DOCUMENTS

| | | | |
|---|---|---|---|
| 7,475,184 B2* | 1/2009 | Lee | 711/103 |
| 7,987,314 B2* | 7/2011 | Honda | 711/103 |
| 2001/0023472 A1* | 9/2001 | Kubushiro et al. | 711/103 |
| 2003/0065866 A1* | 4/2003 | Spencer | 710/306 |
| 2004/0188710 A1* | 9/2004 | Koren et al. | 257/197 |
| 2004/0199714 A1* | 10/2004 | Estakhri et al. | 711/103 |
| 2005/0068802 A1* | 3/2005 | Tanaka | 365/145 |
| 2005/0251617 A1 | 11/2005 | Sinclair et al. | |
| 2006/0053247 A1* | 3/2006 | Cheung et al. | 711/103 |
| 2006/0282610 A1* | 12/2006 | Dariel et al. | 711/103 |
| 2007/0033364 A1* | 2/2007 | Maeda et al. | 711/170 |

FOREIGN PATENT DOCUMENTS

| | | | | |
|---|---|---|---|---|
| JP | WO 2005/022393 | * | 3/2005 | G06F 12/00 |
| WO | 2005043394 A1 | | 5/2005 | |
| WO | WO 2005043394 A1 | * | 5/2005 | |

OTHER PUBLICATIONS

International Preliminary Report of Patentability for International Application No. PCT/IL2006/001393, dated Feb. 3, 2009, 8 pages.

International Preliminary Report on Patentability received in corresponding PCT Application No. PCT/IL2006/001393 mailed Feb. 3, 2009 and International Search Report and Written Opinion received in corresponding PCT Application No. PCT/IL06/01393 mailed Jul. 14, 2008, 10 pages.

Korean Office Action and Translation for Korean Patent Application No. 10-2008-7016627 mailed Apr. 29, 2010, 6 pages.

First Office Action from the Patent Office of the People's Republic of China dated May 11, 2010 and translation for Chinese Patent Application No. 200680050847.4 , 7 pp.

Office Action dated May 6, 2011 issued in Chinese Application No. 200680050847.4 with English translation, 4 pages.

Decision of Rejection issued Feb. 13, 2012 in Chinese Patent Application No. 200680050847.4 with English translation, 6 pages.

Third Office Action issued Jul. 3, 2012 in Chinese Patent Application No. 200680050847.4 with English translation, 15 pages.

Fourth Office Action issued Nov. 2, 2012 in Chinese Patent Application No. 200680050847.4 with English translation, 12 pages.

Fifth Office Action issued Feb. 18, 2013 in Chinese Patent Application No. 200680050847.4 with English translation, 4 pages.

Notice of Reasons of Rejection issued on Dec. 2, 2011 in Japanese Patent Application No. 2008-543997 with English translation, 8 pages.

* cited by examiner

METHOD FOR FLASH-MEMORY MANAGEMENT

This patent application claims the benefit of U.S. Provisional Patent Application No. 60/748,682 filed Dec. 9, 2005.

FIELD AND BACKGROUND OF THE INVENTION

The present invention relates to data-processing systems that use non-volatile memory (NVM) for data and application storage, and methods for managing such storage. Systems and methods are disclosed for improving both the performance and durability of a data-processing system, such as an enhanced smartcard comprising both flash and Electrically-Erasable and -Programmable Read-Only Memories (EEPROM) NVM modules.

A typical example of such a data-processing system is a smartcard. Smartcards are plastic cards with embedded integrated circuits (ICs). Smartcards have been developed as an improvement to magnetic-stripe cards, and offer several advantages over magnetic-stripe cards. For example, the maximum storage capacity of a smartcard is much greater than that of a magnetic-stripe card. High-capacity SIM cards used for smartcard applications typically contain more than 256 KB of memory storage, many contain more than 64 MB memory storage Flash memory is a popular type of memory used in such applications.

Smartcards typically contain memory and a microcontroller (with associated logic memory and software). The data stored within a smartcard is accessed via an interface that is controlled by an operating system and security logic. An example of an advanced large-capacity smartcard is the MegaSIM™ card (available from msystems Ltd., Kefar Saba, Israel). MegaSIM™ cards enable smartcard vendors to provide storage capacity in the SIM (as opposed to external memory card storage) for a variety of advanced mobile services, such as downloading MMS (i.e. multimedia messaging services), MP3 (i.e. media player 3 standard), and video files, providing full personal information management (PIM) functionality, and enabling high-resolution image storage.

A High-capacity SIM card is a standard SIM card with extra storage memory. An EEPROM is part of the standard SIM functionality, and is used for keeping the SIM data files managed via an ISO-7816 SIM interface. Such data include encryption keys and SIM-based contact lists. The EEPROM is considered a highly-secure memory component because the EEPROM is part of the SIM controller, which is more secure than the storage memory. The storage memory is typically commercial flash memory with no special security mechanism. The storage memory is accessible through a high-speed interface (e.g. MMC, SD, and USB), and used to store user data such as pictures, music, video, and applications. Unlike the EEPROM, the storage memory is typically formatted as a standard FAT (File Allocation Table) file system, which is managed by the operating system of the host device (e.g. mobile phone), and not by the SIM card itself.

FIG. 1 is a simplified schematic block diagram of a prior-art data-processing system: a High-capacity SIM card 18. High-capacity SIM card 18 includes a SIM CPU 2 that is connected over a SIM bus 4 to several types of memory. A RAM 6 is a volatile memory mainly used for temporary data storage. RAM 6 is also used as application cache. A ROM 8 is permanent non-erasable storage used for storing the operating system and applications. Some systems might implement erasable memory storage instead of ROM 8 in order to provide flexibility in changing and enhancing the loaded software.

An EEPROM 10 is an electrically-erasable NVM that is byte-programmable. EEPROM 10 is mainly used for storing configuration-related information and, depending on the application, semi-permanent data as well. A large NAND-type flash memory 12 is also an electrically erasable NVM, but flash memory 12 is significantly larger in size than the EEPROM 10. Flash memory 12 is typically used for mass data storage, such as pictures, music, video, and databases (e.g. phone books). EEPROM 10 is erasable "word-by-word" in the sense that every time a word (i.e. the minimum number of bits that can be written to) is written to, the word is erased. Some EEPROMs also provide an optional block-erase command, which helps to write faster. This is in contrast to flash memory 12 that is erasable only "block-by-block." Two interfaces are used for connecting the data-processing system with external devices (e.g. mobile phone). A high-speed interface 14A is used for accessing high-capacity storage and a low-speed interface 14B is an ISO 7816 interface for connection to legacy devices.

The components (SIM CPU 2, SIM bus 4, RAM 6, ROM 8, EEPROM 10, flash memory 12, and interfaces 14A and 14B) reside in a housing 16. Flash memory 12 includes user data 20, flash-memory management data 22, a FAT 24, and file-metadata directories 26. The logic that determines where to store each type of information (i.e. in user data 20 or management data 22) is handled by SIM CPU 2, which is responsible for managing the device resources.

High-capacity SIM card 18 resides in a mobile phone 28 with high-speed interface 14B operationally connected to a phone bus 30. Mobile phone 28 has a phone CPU 32 for performing phone operations, an I/O 34 that represents the user-interface components (e.g. keypad, microphone, speaker, and screen), and a memory 36 for storing an operating system 38 that manages the storage in flash memory 12.

Two major types of silicon-based, NVMs are relevant to the present invention:

(1) EEPROM devices are NVMs made of floating-gate transistors. EEPROM devices behave similarly to random-access memory (RAM); however, the write sequence of an EEPROM is slower than a RAM, and the number of writes to each location is limited to 100,000.

(2) Flash-memory devices are similar to EEPROM devices in that flash devices are also non-volatile, electrically-erasable and -programmable, read-only memories made of flash-type and floating-gate transistors. However, flash devices have certain limitations that make their use at the physical address level a bit sophisticated. In a flash device, it is not possible to rewrite a previously written area of the memory without a prior erase-operation of the area, meaning that the flash cells must be erased (e.g., programmed to "one-logic") before they can be programmed again. EEPROM cells require such an erase-operation as well. The difference is that, in EEPROM, the erase-operation is performed internally by the device as part of the write-operation.

Flash devices are further divided into NAND-type flash devices and NOR-type flash devices. The major difference between NAND-type and NOR-type devices being that a NAND-type device is limited to block-read access, while a NOR-type device has random-read access. Erasure on a flash device can only be performed for relatively large groups of cells, usually called "erase blocks" which are typically 16-128 Kbytes in size in current commercial NAND-type devices (NOR-type devices have larger erase blocks). Therefore, updating the contents of a single byte, or a portion of a kilobyte, requires "housekeeping" operations (i.e. all sections of the erase block that are not to be updated must first be moved elsewhere so that they are preserved during erasure, and then those sections optionally are moved back into their original place).

Furthermore, NAND-type device blocks usually include some "bad blocks". Such blocks are not reliable and their use should be avoided Blocks are designated as bad by the manufacturer during initial device testing, and later by application software when the blocks' failure is detected during use of the device in the field Flash devices, especially NAND-type devices, have higher densities, and are relatively inexpensive as compared to EEPROM devices. This makes a flash device very attractive as a solid-state hard-disk replacement.

To overcome limitations in flash devices of the prior art, a Flash File System (FFS) was disclosed in Ban, U.S. Pat. No. 5,404,485 (henceforth referred to as Ban '485), which is assigned to the assignee of the present invention, and is hereby incorporated by reference as if fully set forth herein. FFS provides a system of data storage and manipulation in flash devices that allows these devices to emulate magnetic disks. In the prior art, applications or operating systems interact with the flash storage sub-system using virtual addresses rather than physical addresses. There is an intermediary layer between the software application and the physical device that provides mapping from the virtual addresses to the physical addresses.

While the software may view the storage system as having a contiguous defect-free medium that can be read or written to randomly without limitations, the physical-addressing scheme has "holes" in the scheme's address range (due to bad blocks, for example), and portions of data that are adjacent to each other in the virtual address range might be separated in the physical address range. The intermediary layer that performs the mapping described above may be a software driver. Within a typical smartcard, the driver is run on the smartcard's embedded CPU. Alternatively, the intermediary layer may be embedded within a controller that controls the flash device, and serves as the interface for the main CPU of the host computer when the host computer accesses the storage.

Software or firmware implementations that perform such address mappings are typically called "flash management systems" or "flash file systems." The latter term is a misnomer, as the implementations do not necessarily support "files" in the sense of files that are used in operating systems of personal computers, but rather support block device interfaces similar to those exported by hard-disk software drivers.

All types of silicon-based NVMs suffer from wear. This means that after a certain number of write/erase cycles, the probability that the relevant block or byte will malfunction is high. A typical number of data cycling (called data endurance) is 100,000 erase/write cycles, after which the probability that a location can no longer be erased is high.

Prior art devices using the above-described flash management system reserve a section of the flash memory for maintaining the management information (e.g. the mapping tables). Each time the flash device is updated with new data, the operation involves writing the actual data and another write of the updated management information. This process slows down the writing process as these two write-operations have to be performed serially. Another drawback of using the flash area for storing management information is due to the block-access nature of flash memory. The update of a single byte involves a full-page write-operation and possibly a block erase-operation, which makes this process even slower.

Another factor to be considered is the fact that a data-processing system typically organizes data in files that are associated with file metadata that typically contains the file name, size, attributes (e.g. access permissions), and the physical address of at least one sector that keeps the file data. The file metadata is kept in a directory and a FAT that records allocations of storage addresses to files. Prior art systems keep the FAT in a memory area assigned for this purpose within the same data-storage device. Writing a new file or updating an existing file involves several serial write-operations: one for writing the actual data, one for writing to the directory, and another one for writing to the FAT. If the storage device is a flash device, as described above, each of these write-operations actually involves two write-operations: one to write to the actual sector, and the other to update the flash management data. Although the management directory update may require writing only a few bytes, writing to a flash memory always requires a full-page write-operation and possibly a block erase-operation.

Prior art described in Chen, U.S. Pat. No. 6,456,528, suggests writing FAT data to a location within the same device that has two different methods of storing the information. This prior art discusses the benefit of storing the FAT using one method, and the data using the other. However, this prior art uses the same storage device for both data and management data. This prior art does not solve the problems of two serial write-operations, and the need for a full-page update as discussed in the present application.

Another example of a prior art system is described in Auclair and Harari, U.S. Pat. No. 5,778,418. This patent teaches a combination of a solid-state memory device and a rotating disk for enhancing the performance of the disk. The patent describes mapping between the logic-sector address and the physical data-storage location in either a mechanical hard drive or a solid-state memory device. This prior-art system does not address the problem of improving the efficiency of write-operations by differentiating between management-related data and the actual data to be written to the device as discussed in the present application.

It would be desirable to have a system that uses two independent storage devices. Such a system would allow the two write-operations described above (one for the user data and one for the management data) to be performed in parallel, thereby improving performance.

SUMMARY OF THE INVENTION

For the purpose of clarity, several terms which follow are specifically defined for use within the context of this application. The term "mapping table" is used herein to refer to the flash file system (FFS) management information. The term "file metadata" is used herein to refer to the file system (FS) management information. The term "management data" is used herein to refer to management information used by either FFS or FS software modules.

The term "user data" is used herein to refer to the actual files stored by the user. The present invention applies to both single-level-cell (SLC) flash memories and multi-level-cell (MLC) flash memories. While the subsequent discussion focuses primarily on SLC cells, it will be clear to those skilled in the art how the present invention applies to MLC cells. The terms "erasing" and "writing" are used herein to refer to setting threshold voltages of a memory cell, where erasing typically sets the voltages to correspond to one-logic values, and writing typically sets the voltages, in the case of SLC cells, to correspond to zero-logic values. The terms "writing" and "programming" are used interchangeably herein.

The term "high-capacity SIM card" is used herein to refer to a SIM card that, in addition to the legacy SIM card functionality described above, contains a large (i.e., >256 KB, preferably >64 MB) amount of memory storage (e.g. flash memory) that is typically used for storing image and music files. A high-capacity SIM card usually has a high-speed interface, such as an SD™ (Secure Digital™) or MMC (multi-media card) interface, for accessing the mass storage.

It is the purpose of the present invention to provide systems and methods for improving both the performance and durability of a data-processing system, such as a high-capacity SIM card comprising both flash and EEPROM NVM modules.

Two different type of management applications are involved with the present invention:

(1) Flash File System (FFS) (which, despite the name, has nothing to do with files) manages the flash memory as a block device, FFS handles wear leveling, error detection and correction, and performs erase-operations when required. FFS maintains the mapping table that logically maps virtual addresses to physical device addresses (i.e. translates the sector numbers to the physical address currently allocated for the logical/virtual addresses (i.e. sector numbers)).

(2) File System (FS) is typically part of the operating system in use. FS stores file metadata (including file names, file attributes) in a directory area and a File Allocation Table (FAT).

According to the present invention, the flash memory module is used for storing data while a portion of (or all) the management data is stored in the EEPROM module. The following major improvements are achieved by storing the FFS mapping table in EEPROM:

(a) Enhanced performance: In most cases, only a few bytes need to be written. If the mapping table was stored in the flash memory, a whole page would be rewritten upon every write to the flash memory. In addition, if no free pages are available, this operation involves a block erase-operation that makes this process even slower.

(b) Lower memory wear: Because only a few bytes are involved in a typical management data update, using EEPROM eliminates the need to rewrite a full page.

(c) Simplified, more efficient FFS management. The FFS management application can directly access the relevant bytes in EEPROM with no need for a full-page access.

Additional improvement of the present invention may be achieved by storing file metadata, or specifically the FAT, in the EEPROM instead of in the flash memory. The FAT is typically updated every time the file is being updated. The present invention uses byte-accessed memory (EEPROM) for storing the FAT. This results in enhanced performance and lower wear similar to what is achieved by storing the mapping table information in the EEPROM instead of in the flash memory.

The present invention is useful in any flash-based data storage system, but is especially useful in a high-capacity SIM card where an EEPROM is typically present for other reasons. It should be noted that the present invention is not limited to a specific method of managing the flash memory. Any flash-management algorithm may be enhanced by placing the file metadata in the EEPROM and the user data in the flash memory.

Therefore, according to the present invention, there is provided for the first time a SIM card, the card including: (a) a first NVM for storing user data; and (b) a second NVM, separate from the first NVM, for storing management data related to the user data.

Preferably, the first NVM is block-erasable and the second NVM is word-erasable.

Preferably, the first NVM is a flash memory and the second NVM is an EEPROM.

Preferably, the card further includes: (c) a housing for accommodating the first NVM and the second NVM. Most preferably, the housing is configured to have a Smartcard ID1 or ID-000 form factor.

Preferably, the management data includes a mapping table for mapping virtual addresses, of the first NVM, to physical device addresses.

Preferably, the user data and the management data are organized in a file system.

Most preferably, the management data includes at least one file allocation table.

Most preferably, the management data includes at least one files directory, wherein at least one files directory includes at least one item selected from the group consisting of a file name, a file size, a file attribute, and a physical address of a file sector.

According to the present invention, there is provided for the first time a method for managing data in a SIM card, the method including the steps of: (a) receiving user data to be stored in the card; (b) writing the user data to a first NVM; and (c) writing management data, related to the user data, to a second NVM separate from the first NVM.

Preferably, the management data includes a mapping table for mapping virtual addresses, of the first NVM, to physical device addresses.

Preferably, the user data and the management data are organized in a file system.

Most preferably, the management data includes at least one file allocation table.

Most preferably, the management data includes at least one files directory, wherein at least one files directory includes at least one item selected from the group consisting of: a file name, a file size, a file attribute, and a physical address of a file sector.

These and further embodiments will be apparent from the detailed description and examples that follow.

BRIEF DESCRIPTION OF THE DRAWINGS

The present invention is herein described, by way of example only, with reference to the accompanying drawings, wherein.

DESCRIPTION OF THE PREFERRED EMBODIMENTS

The present invention relates to systems and methods for improving both the performance and durability of a data-processing system. The principles and operation for improving both the performance and durability of a data-processing system, according to the present invention, may be better understood with reference to the accompanying description and the drawings.

Figure 2:
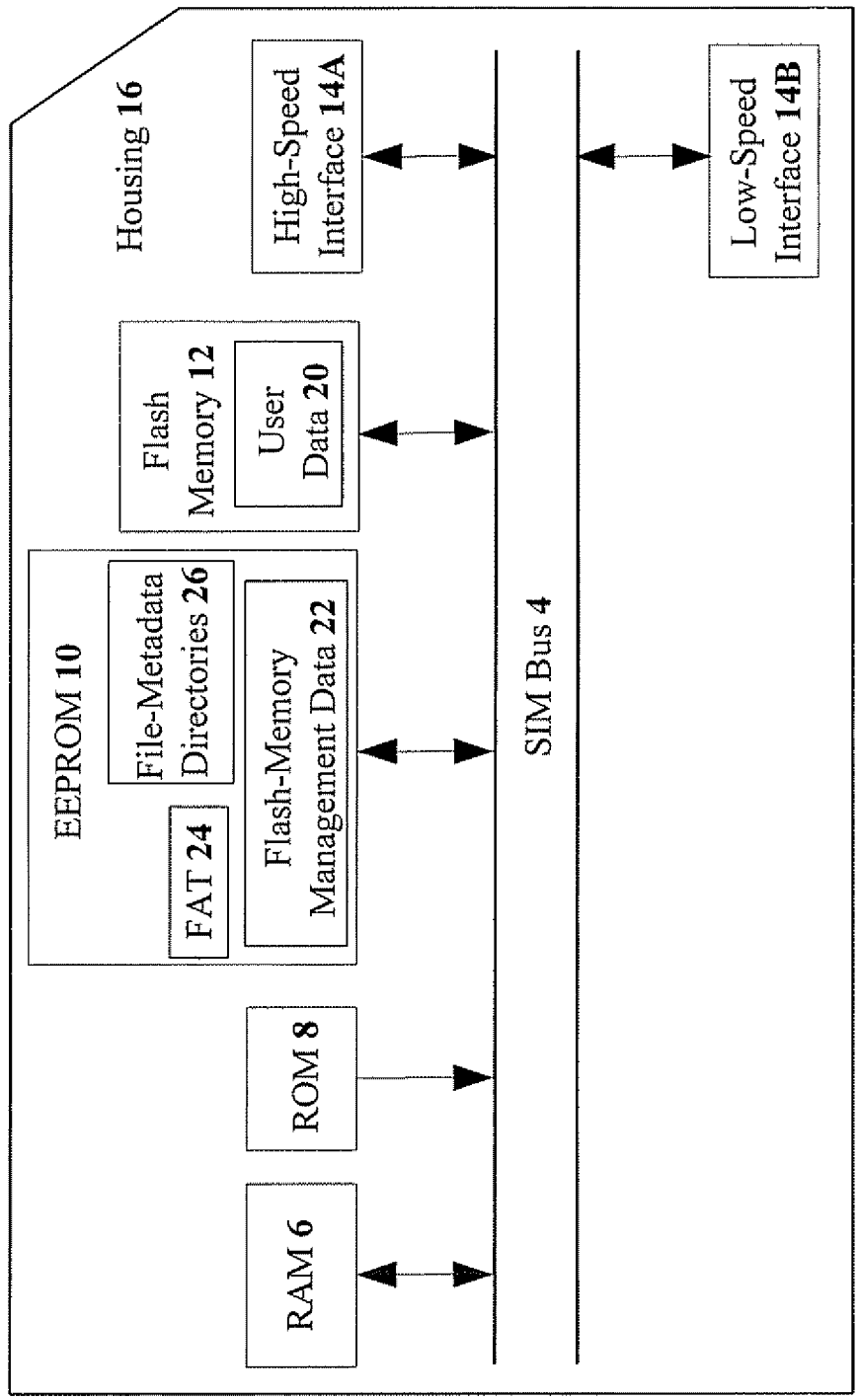
FIG. 2 is a simplified schematic block diagram of a typical data-processing system, according to a preferred embodiment of the present invention.

Referring now to the drawings, FIG. 2 is a simplified schematic block diagram of a typical data-processing system, according to a preferred embodiment of the present invention.

Figure 1:
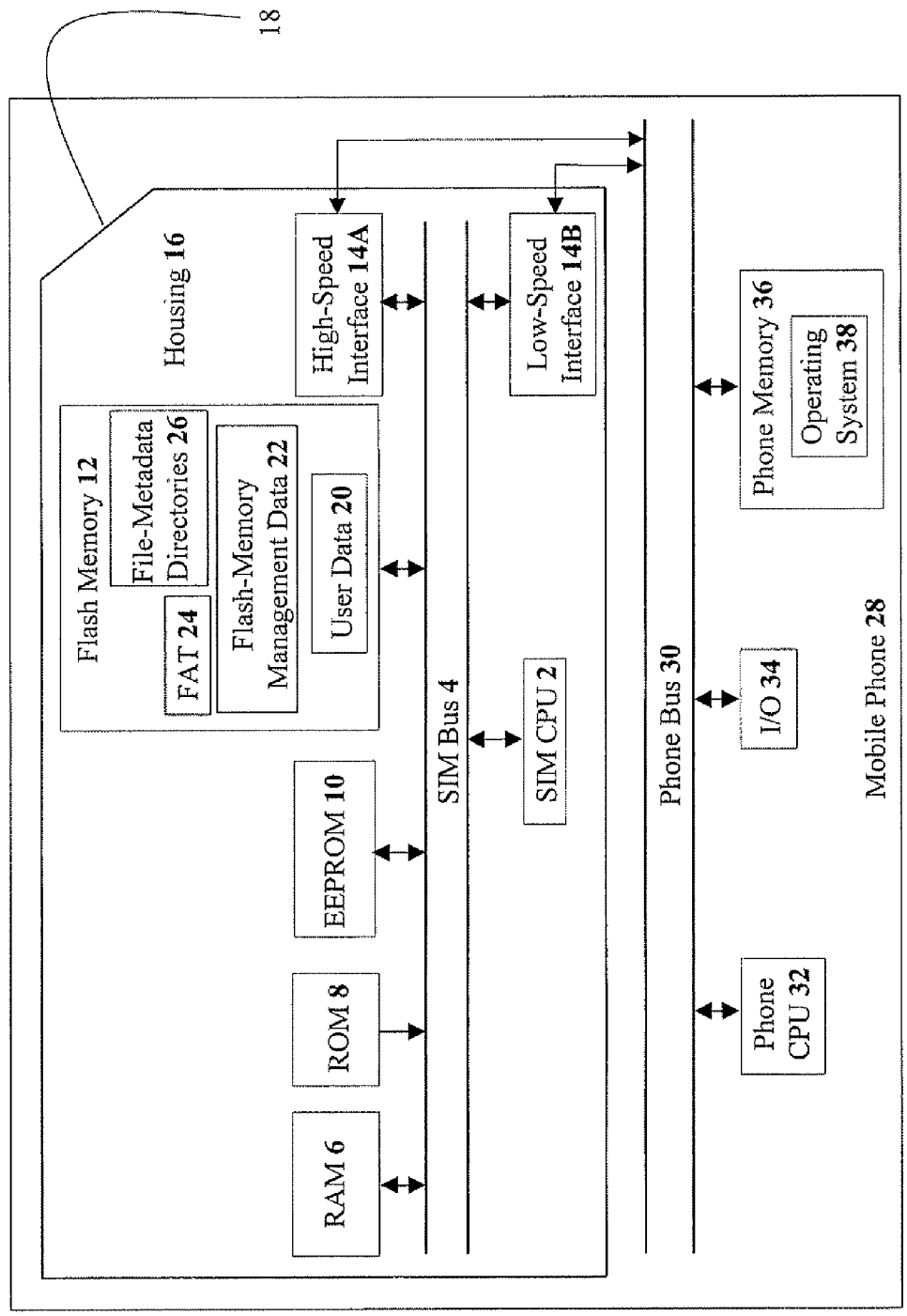
FIG. 1 is a simplified schematic block diagram of a prior-art data-processing system.

Specifically, FIG. 2 shows the high-capacity SIM card of FIG. 1 as modified according to the principles of the present invention SIM bus 4 connects several types of memory RAM 6 is a volatile memory mainly used for temporary data storage RAM 6 is also used as application cache. ROM 8 is permanent non-erasable storage used for storing the operating system and applications. Some systems might implement erasable memory storage instead of ROM 8 in order to provide flexibility in changing and enhancing the loaded software. As specified by the present invention, management data 22, FAT 24, and file-metadata directories 26, are stored in EEPROM 10 (in contrast to the configuration shown in FIG. 1), while user data 20 is stored in flash memory 12.

EEPROM 10 is an electrically-erasable NVM that is byte-programmable. EEPROM 10 is used for storing configuration-related information and, depending on the application, semi-permanent data as well. However, in addition to those uses of EEPROM 10 that are common to the prior art, EEPROM 10 of the present invention also stores flash-memory management data 22, FAT 24, and file metadata directories 26. Flash memory 12 is also an electrically erasable NVM, but flash memory 12 is significantly larger in size than the EEPROM 10. Flash memory 12 is typically used for mass data storage, such as pictures, music, video, and databases (e.g. phone books). Interfaces 14A and 14B are used for connecting the data-processing system with external devices (e.g. mobile phone). The components (Bus 4, RAM 6, ROM 8, EEPROM 10, flash memory 12, and interfaces 14A and 14B) reside in housing 16. In preferred embodiments, housing 16 has a smartcard form factor (e.g. Smartcard ID1 or ID-000).

Figure 3:
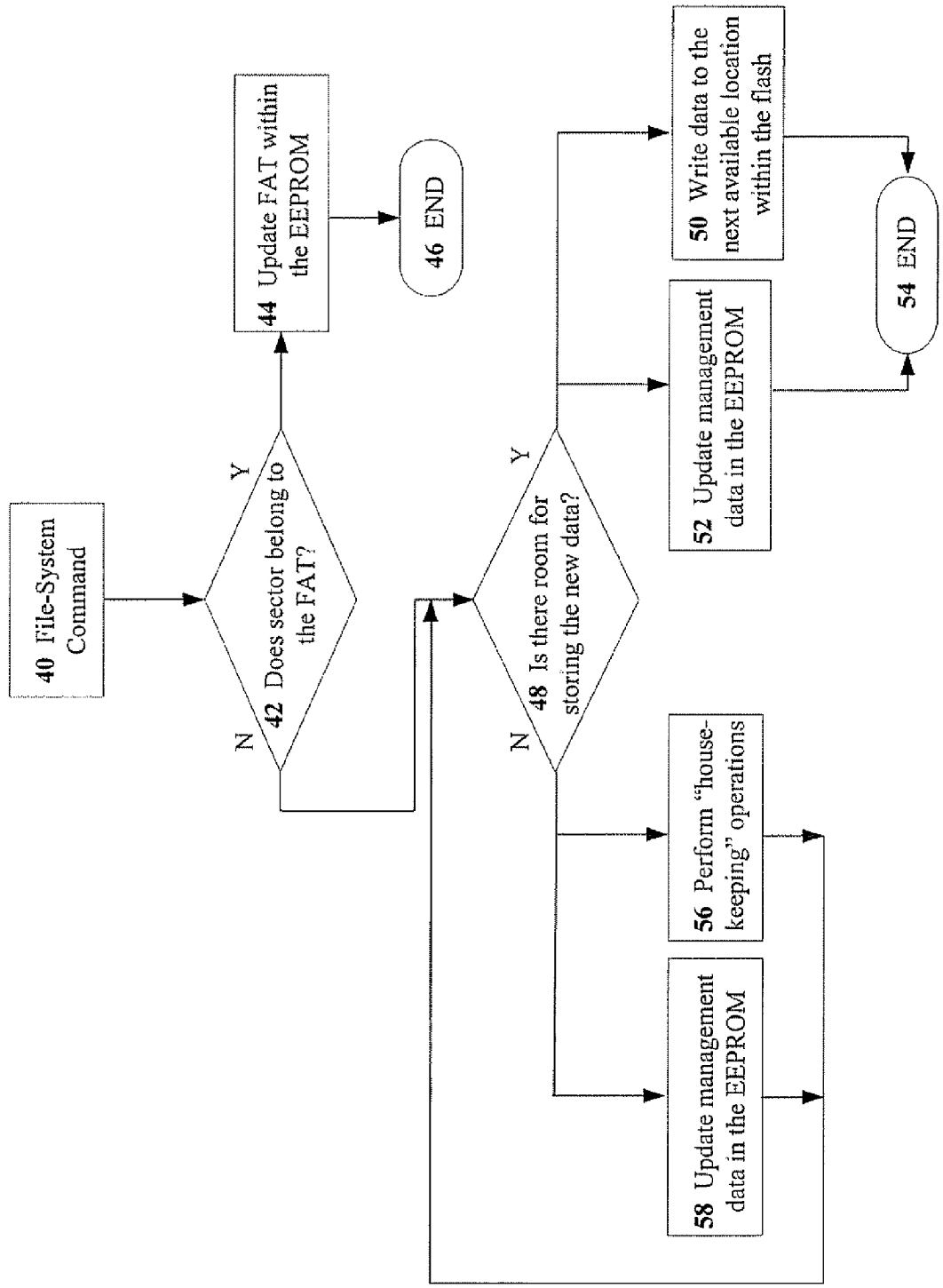
FIG. 3 is a flowchart of the typical operational procedure of the write sector implemented as part of the memory device driver, according to a preferred embodiment of the present invention.

FIG. 3 is a flowchart of the typical operational procedure of the write sector implemented as part of the memory device driver, according to a preferred embodiment of the present invention. In describing the operational procedure shown in FIG. 3, reference to the components shown in FIG. 2 is made for better clarity. This example demonstrates a system that keeps management data 22 and FAT 24 in EEPROM 10, while other file metadata and user data 20 are stored in flash memory 12. A file-system command (e.g. write file, erase file, create file, create directory) is received by the device via an interface (e.g. smartcard interfaces 14A and 14B, shown in FIG. 2), and the device initiates an operation on a sector (Block 40). The sector number, as defined by the operation request, is examined to determine whether or not the sector number belongs to FAT 24 (Block 42).

It is assumed that the firmware executing this algorithm is aware of the FAT structure and physical location. If the firmware executing the algorithm is not aware of the FAT structure and physical location, this step (Block 42) may be skipped, and all sectors are treated as non-FAT. If the sector is identified as part of FAT 24, which according to the present invention is stored within EEPROM 10, then FAT 24 is updated (Block 44). In this case, no data is required to be written to flash memory 12, and the process terminates (Block 46). If the sector is not a FAT sector, the firmware needs to allocate a free area for storing user data 20 (Block 48). If there is room for user data 20, the firmware writes user data 20 to flash memory 12 (Block 50), and updates management data 22 in EEPROM 10 (Block 52). Both operations 50 and 52 are performed in parallel, and then the process terminates (Block 54).

In the smartcard implementation, this means that CPU 2 does not have to wait until user data 20 is actually written to flash memory 12 before updating management data 22 within EEPROM 10. If no room is available, the firmware performs "housekeeping" operations (Block 56) that involve erasing unused blocks, and compacting user data 20 in flash memory 12. In addition, management data 22 is updated in EEPROM 10 (Block 58) to reflect the rearrangement of user data 20, which is being performed in Block 56. Both operations (Blocks 56 and 58) are performed in parallel (i.e. CPU 2 does not wait for flash-related operations (Block 56) to complete before CPU 2 updates management data 22 in EEPROM 10 (Block 58)).

The step of erasing unused blocks (Block 56) is necessary for the following reason. In order to write to flash memory 12, it is necessary to make sure that all bits of the block to be written to have one-logic. The write-operation can only change the representative voltage level from one-logic to zero-logic (changing from zero-logic to one-logic is performed by an erase-operation). If the block is not used, it is not clear if the block has already been erased (i.e. all bits of the block have one-logic). Typically, unused blocks will not have been previously erased.

While the invention has been described with respect to a limited number of embodiments, it will be appreciated that many variations, modifications, and other applications of the invention may be made.

What is claimed is:

1. A subscriber identity module (SIM) card, the SIM card comprising:
   a first non-volatile memory (NVM) having a first memory type;
   a second NVM that is distinct from the first NVM, the second NVM having a second memory type that is different than the first memory type; and
   a processing unit configured to receive a request associated with user data to be stored in the first NVM and, responsive to determining that there is insufficient available space in the first NVM to store the user data, to perform a housekeeping operation that includes erasing unused blocks of the first NVM and compacting stored data in the first NVM and a first update of a mapping table in the second NVM in parallel with and based on the housekeeping operation, the processing unit further configured to write the user data to the first NVM and to write management data associated with the user data into the second NVM in parallel with writing the user data in the first NVM, wherein writing the management data includes performing a second update of the mapping table based on the user data being written to the first NVM.

2. The SIM card of claim 1, wherein the first NVM is block-erasable, and wherein the second NVM is word-erasable and byte-accessible.

3. The SIM card of claim 1, wherein the first memory type is a flash memory, and wherein the second memory type is an electrically erasable programmable read only memory (EEPROM).

4. The SIM card of claim 1, further comprising a housing to accommodate the first NVM and the second NVM, wherein the housing has a Smartcard ID1 form factor or a Smartcard ID-000 form factor.

5. The SIM card of claim 1, wherein the management data includes at least one files directory, wherein the at least one files directory includes at least one of a file name, a file size, a file attribute, and a physical address of a file sector.

6. The SIM card of claim 1, wherein the second NVM is more secure than the first NVM.

7. The SIM card of claim 6, wherein the second NVM is included in a controller of the SIM card.

8. The SIM card of claim 1, wherein the management data is stored in the second NVM includes file metadata directories.

9. The SIM card of claim 1, wherein the user data and the management data are organized in a file system.

10. The SIM card of claim 1, further comprising a random access memory (RAM), wherein the RAM comprises a volatile memory, wherein the management data includes at least one files directory, and wherein the at least one files directory includes at least one of a file name or a file size.

11. The SIM card of claim 1, wherein the user data is stored at the first NVM in response to receipt of a file system command, wherein the file system command defines a sector number associated with a file access table or the first NVM.

12. The SIM card of claim 11, wherein the file system command comprises one of a write file command, an erase file command, a create file command, or a create directory command.

13. The SIM card of claim 1, wherein the user data includes file data, wherein the management data corresponds to management information used by a flash file system or a file system, and wherein the management data is based on the user data.

14. A method of managing data stored at a subscriber identity module (SIM) card, the method comprising:
   receiving a request associated with user data to be stored at a first non-volatile memory (NVM) of the SIM card, the first NVM having a first memory type, the SIM card further including a second NVM that is separate from the first NVM, the second NVM having a second memory type that is different than the first memory type
   in response to a determination that there is no available space in the first NVM to store
   the user data, performing:
      a housekeeping operation that includes erasing unused blocks of the first NVM and compacting stored data in the first NVM; and
      a first update of a mapping table in the second NVM in parallel with and based on the housekeeping operation, wherein the housekeeping operation and the first update are initiated by a processing unit of the SIM card;
   writing the user data to the first NVM of the SIM card; and
   writing management data associated with the user data into the second NVM in parallel with writing the user data in the first NVM, wherein writing the management data includes performing a second update of the mapping table based on the user data being written to the first NVM.

15. The method of claim 14, wherein the management data includes a mapping table to map a virtual address of the first NVM to a physical device address.

16. The method of claim 14, wherein the management data includes at least one file allocation table.

17. The method of claim 14, wherein the second NVM is included in a controller of the SIM card and the first NVM is external to the controller.

18. The method of claim 14, wherein the second NVM is more secure than the first NVM and includes at least one encryption key.

19. The method of claim 14, wherein the first NVM is block-erasable, and wherein the second NVM is word-erasable and byte-accessible.

20. A method of storing data in a subscriber identity module (SIM) card, the method comprising:
   storing user data at a first non-volatile memory (NVM) of the SIM card, the first NVM having a first memory type;
   storing management data at a second NVM of the SIM card, the second NVM having a second memory type that is different than the first memory type, wherein the second NVM is separate from the first NVM;
   responsive to determining that there is insufficient available space in the first NVM to store new data, performing:
      a housekeeping operation that includes erasing unused blocks of the first NVM and compacting stored data in the first NVM; and
      a first update of a mapping table in the second NVM in parallel with and based on the housekeeping operation, wherein the housekeeping operation and the first update are initiated by a processing unit of the SIM card;
   writing the new data to the first NVM; and
   writing updated management data associated with the new data into the second NVM in parallel with writing the new data in the first NVM, wherein writing the updated management data includes performing a second update of the mapping table based on the new data being written to the first NVM.

21. The method of claim 20, wherein the second NVM is included in a controller of the SIM card.

22. The method of claim 20, wherein the second NVM is included in a controller of the SIM card and the first NVM is external to the controller.

23. The method of claim 20, wherein the second NVM includes encryption keys.

* * * * *